(12) United States Patent
Kuo et al.

(10) Patent No.: US 9,799,778 B2
(45) Date of Patent: Oct. 24, 2017

(54) CHIP PACKAGE HAVING A TRENCH EXPOSED PROTRUDING CONDUCTIVE PAD

(71) Applicant: XINTEC INC., Taoyuan (TW)

(72) Inventors: Yi-Ying Kuo, Taoyuan (TW);
Ming-Chieh Huang, Kaohsiung (TW);
Hsi-Chien Lin, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/157,776

(22) Filed: May 18, 2016

(65) Prior Publication Data

US 2016/0343882 A1 Nov. 24, 2016

Related U.S. Application Data

(60) Provisional application No. 62/164,218, filed on May 20, 2015.

(51) Int. Cl.
*H01L 31/02* (2006.01)
*H01L 31/18* (2006.01)
*H01L 31/0216* (2014.01)

(52) U.S. Cl.
CPC .... *H01L 31/02002* (2013.01); *H01L 31/0216* (2013.01); *H01L 31/186* (2013.01); *H01L 2224/11* (2013.01)

(58) Field of Classification Search
CPC ........... H01L 31/02002; H01L 31/0216; H01L 31/186
See application file for complete search history.

(56) References Cited

U.S. PATENT DOCUMENTS

| | | | | |
|---|---|---|---|---|
| 7,157,742 B2* | 1/2007 | Badehi | ............... | H01L 23/3114 257/225 |
| 7,633,133 B2* | 12/2009 | Noma | ............... | H01L 27/14618 257/433 |
| 7,935,568 B2* | 5/2011 | Oganesian | .......... | H01L 23/3114 438/106 |
| 8,575,018 B2* | 11/2013 | Lin | ................... | H01L 23/49827 257/737 |

(Continued)

FOREIGN PATENT DOCUMENTS

TW 200705699 2/2007
TW 200908241 2/2009

(Continued)

*Primary Examiner* — Ida M Soward
(74) *Attorney, Agent, or Firm* — Liu & Liu

(57) ABSTRACT

A chip package includes a chip, an insulating layer, a flowing insulating material layer and conductive layer. The chip has a conductive pad, a side surface, a first surface and a second surface opposite to the first surface, which the side surface is between the first surface and the second surface, and the conductive is below the first surface and protruded from the side surface. The insulating layer covers the second surface and the side surface, and the flowing insulating material layer is disposed below the insulating layer, and the flowing insulating material layer has a trench exposing the conductive pad protruded form the side surface. The conductive layer is disposed below the flowing insulating material layer and extended into the trench to contact the conductive pad.

21 Claims, 6 Drawing Sheets

(56) References Cited

U.S. PATENT DOCUMENTS

| | | | | |
|---|---|---|---|---|
| 8,716,109 B2* | 5/2014 | Ni | ............ | B81B 7/0051 |
| | | | | 438/113 |
| 8,872,196 B2* | 10/2014 | Lee | ............ | H01L 31/12 |
| | | | | 257/82 |
| 8,890,191 B2* | 11/2014 | Shiu | ............ | H01L 27/14618 |
| | | | | 257/98 |
| 8,951,836 B2* | 2/2015 | Yen | ............ | B81B 7/007 |
| | | | | 257/774 |
| 8,959,757 B2* | 2/2015 | Dang | ............ | H01L 23/552 |
| | | | | 29/825 |
| 9,070,643 B2* | 6/2015 | Nagata | ............ | H01L 23/481 |
| 9,190,362 B2* | 11/2015 | Chien | ............ | H01L 27/14618 |
| 9,406,578 B2* | 8/2016 | Wen | ............ | H01L 21/268 |
| 2008/0111228 A1* | 5/2008 | Yu | ............ | H01L 23/3114 |
| | | | | 257/690 |
| 2010/0187697 A1* | 7/2010 | Tsai | ............ | H01L 21/76898 |
| | | | | 257/773 |
| 2011/0079903 A1* | 4/2011 | Liu | ............ | H01L 24/03 |
| | | | | 257/738 |
| 2011/0215450 A1* | 9/2011 | Chi | ............ | H01L 23/48 |
| | | | | 257/660 |
| 2012/0161308 A1* | 6/2012 | Chu | ............ | H01L 21/561 |
| | | | | 257/692 |
| 2012/0184070 A1* | 7/2012 | Chen | ............ | H01L 21/76898 |
| | | | | 438/114 |
| 2013/0196470 A1* | 8/2013 | Tsai | ............ | H01L 23/552 |
| | | | | 438/113 |
| 2014/0327152 A1* | 11/2014 | Liu | ............ | H01L 23/481 |
| | | | | 257/774 |
| 2015/0132949 A1* | 5/2015 | Lin | ............ | H01L 21/481 |
| | | | | 438/667 |
| 2015/0137341 A1* | 5/2015 | Liu | ............ | H01L 23/5386 |
| | | | | 257/692 |
| 2016/0190353 A1* | 6/2016 | Liao | ............ | H01L 27/14618 |
| | | | | 257/432 |
| 2016/0307779 A1* | 10/2016 | Chen | ............ | H01L 21/561 |
| 2016/0322312 A1* | 11/2016 | Shen | ............ | H01L 23/564 |

FOREIGN PATENT DOCUMENTS

| | | |
|---|---|---|
| TW | 200908306 | 2/2009 |
| TW | 201110676 | 3/2011 |
| TW | 201327732 | 7/2013 |

* cited by examiner

CHIP PACKAGE HAVING A TRENCH EXPOSED PROTRUDING CONDUCTIVE PAD

RELATED APPLICATIONS

This application claims priority to U.S. provisional Application Ser. No. 62/164,218, filed May 20, 2015, which is herein incorporated by reference.

BACKGROUND

Field of Invention

The present invention relates to a chip package and a manufacturing method thereof.

Description of Related Art

Along with the necessary of electronic devices toward lighter and more compact, the semiconductor chip corresponding to the electronic device has a reduced size and increased wiring density. Therefore, it is more difficult and challenging to fabricate a semiconductor chip package in the subsequent process for the semiconductor chip. Wafer-level chip package is a method of packaging the semiconductor chip, which means that all the chips are packaged and tested after completion of manufacturing these chips on the wafer, and then the wafer is cut into single chip packages.

Since the size of the semiconductor chip is decreased and the functional density on the semiconductor chip is increased, the insulating property of the chip is one of the important research directions in the chip packaging techniques to avoid erroneous electrical connection. Generally, an epoxy material has advantages of excellent insulating property, low costs and simple process, so it is widely applied to prepare the isolation layer of the chip package. However, the epoxy material has flowability and is easily affected by the gravity to aggregate, which is not benefit for forming uniform isolation layer, and thus decreases the yield of the chip package.

SUMMARY

Thus, the present disclosure provides a chip package and a manufacturing method thereof to enhance insulating property between internal wires of the chip package.

The present disclosure provides a chip package, which includes a chip, an insulating layer, a flowing insulating material layer and conductive layer. The chip has a conductive pad, a side surface, a first surface and a second surface opposite to the first surface, which the side surface is between the first surface and the second surface, and the conductive is below the first surface and protruded from the side surface. The insulating layer covers the second surface and the side surface, and the flowing insulating material layer is disposed below the insulating layer, and the flowing insulating material layer has a trench exposing the conductive pad protruded form the side surface. The conductive layer is disposed below the flowing insulating material layer and extended into the trench to contact the conductive pad.

In various embodiments of the present disclosure, the insulating layer includes oxide, nitride, oxynitride, or combinations thereof.

In various embodiments of the present disclosure, the insulating layer includes silicon oxide, silicon nitride, silicon oxynitride, or combinations thereof.

In various embodiments of the present disclosure, the flowing insulating material layer includes an epoxy.

In various embodiments of the present disclosure, a thickness of the insulating layer is in a range from about 0.5 μm to about 1.5 μm.

In various embodiments of the present disclosure, the flowing insulating material layer has a thickness of 20 μm to 25 μm below the second surface.

In various embodiments of the present disclosure, the flowing insulating material layer has a thickness of 6 μm to 10 μm on the side surface.

In various embodiments of the present disclosure, the chip package further includes a protective layer and an external conductive connection. The protective layer is disposed below the conductive layer, and the protective layer has an opening to expose the conductive layer. The external conductive connection is disposed in the opening and in contact with the conductive layer.

In various embodiments of the present disclosure, the chip package further includes a sensing region disposed below the first surface.

In various embodiments of the present disclosure, the chip package further includes a spacer layer and a transparent substrate. The space layer is disposed above the first surface to surround the sensing region, and the transparent substrate is disposed above the space layer to cover the sensing region.

Another aspect of the present disclosure provides a method of fabricating a chip package, and the method includes following steps. A wafer is received, which the wafer has a conductive pad, a first surface and a second surface opposite to the first surface, and the conductive pad is below the first surface. A portion of the wafer is removed to form a side surface between the first surface and the second surface, and the conductive pad is protruded from the side surface. An insulating layer is formed to cover the second surface and the side surface, and a flowing insulating material layer is formed to cover the insulating layer and the conductive pad. A trench is formed in the flowing insulating material layer to expose the conductive pad protruded from the side surface, and a conductive layer is formed below the flowing insulating material layer, which the conductive layer is extended into the trench to contact the conductive pad.

In various embodiments of the present disclosure, the wafer further includes a sensing region below the first surface.

In various embodiments of the present disclosure, the method further includes following steps. A space layer is formed above the first surface to surround the sensing region, and a transparent substrate is formed above the space layer to cover the sensing region.

In various embodiments of the present disclosure, the method further includes following steps. A protective layer is formed below the conductive layer, and an opening is formed in the protective layer to expose the conductive layer.

In various embodiments of the present disclosure, the method further includes forming an external conductive connection in the opening to contact the conductive layer.

In various embodiments of the present disclosure, the method further includes dicing the protective layer, the conductive layer, the space layer and the transparent substrate along the trench to form the chip package.

In various embodiments of the present disclosure, the insulating layer is formed by chemical vapor depositing.

In various embodiments of the present disclosure, the flowing insulating material layer is formed by coating, depositing or printing.

In various embodiments of the present disclosure, the insulating layer includes oxide, nitride, oxynitride, or combinations thereof.

In various embodiments of the present disclosure, the insulating layer includes silicon oxide, silicon nitride, silicon oxynitride, or combinations thereof.

In various embodiments of the present disclosure, the flowing insulating material layer includes an epoxy.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
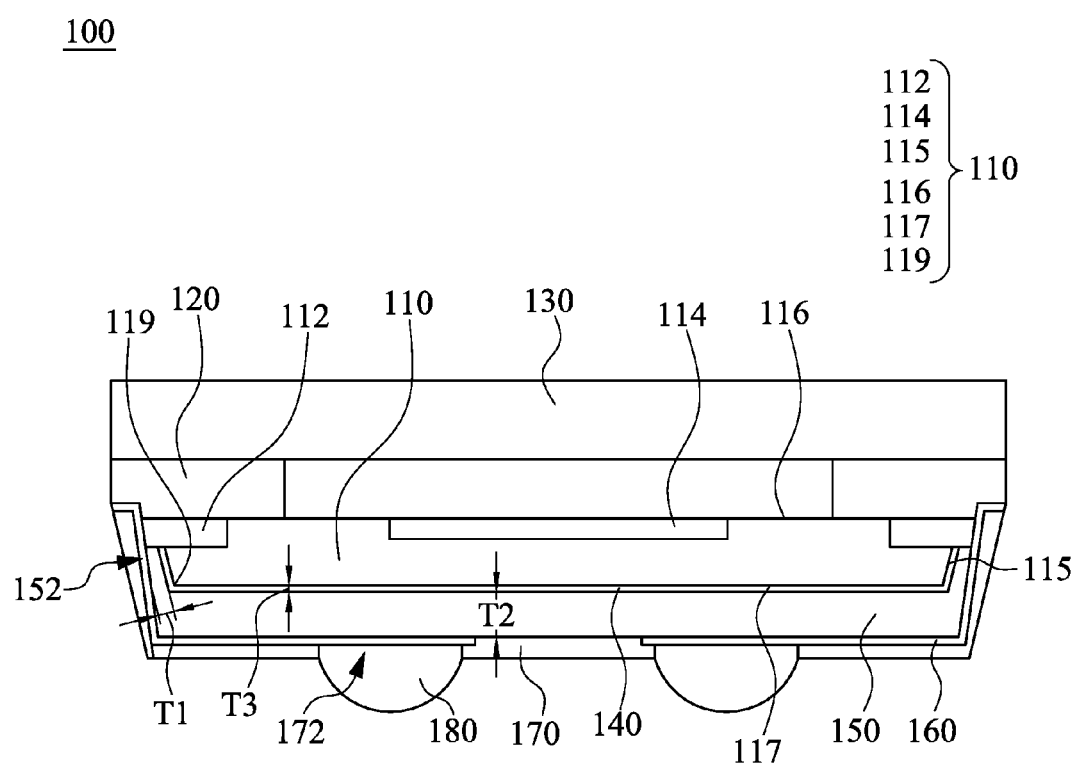
FIG. 1 is a cross-sectional view of a chip package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (rotated 90 degrees or at other orientations) and the spatially relative descriptors used herein may likewise be interpreted accordingly.

FIG. 1 is a cross-sectional view of a chip package 100, in accordance with some embodiments of the present disclosure. As shown in FIG. 1, the chip package 100 includes a chip 110, a space layer 120, a transparent substrate 130, an insulating layer 140, a flowing insulating material layer 150, a conductive layer 160, a protective layer 170 and an external conductive connection 180. The chip 110 has a conductive pad 112, a sensing region 114, a side surface 115, a first surface 116 and a second surface 117 opposite to the first surface 116. The side surface 115 is between the first surface 116 and the second surface 117 to connect the second surface 117 and the conductive pad 112. The conductive pad 112 and the sensing region 114 are below the first surface 116, and the conductive pad 112 is protruded from the side surface 115 of the chip 110. In some embodiments, the sensing region 114 is disposed between two conductive pads 112 and electrically connected to these conductive pads 112. In some embodiments, the chip 110 further includes a semiconductor device, an inter-layer dielectric layer (ILD), an inter-metal dielectric layer (IMD), a passivation layer and an interconnection structure, and the conductive pad 112 is one of metal layers of the interconnection structure.

The space layer 120 is disposed above the first surface 116 to surround the sensing region 114, and the transparent substrate 130 is disposed above the space layer 120 to cover the sensing region 114. Light is allowed to pass through the transparent substrate 130, and the space layer 120 maintains a space between the transparent substrate 130 and the sensing region 114. In addition, the transparent substrate 130 and space layer 120 together constitute a cavity to protect the sensing region 114. Therefore, incident light signal is effectively converted into digital signal when the light passes through the transparent substrate 130 and reaches the sensing region 114. In some embodiments, an adhesive layer is between the space layer 120 and the first surface 116, so as to adhere the space layer 120 to the first surface 116.

The insulating layer 140 covers the second surface 117 and further extends to cover the side surface 115, and the flowing insulating material layer 150 is below the insulating layer 140 and has a trench 152 exposing the conductive pad 112 protruded form the side surface 115. Before curing, the flowing insulating material layer 150 has flowability, so it is easily affected by gravity and difficult to control uniformity thereof. If the flowing insulating material layer 150 having a small thickness T1 on the side surface 115, a distance between the conductive layer 160 and the chip 110 will be reduced. Therefore, insulating property of the chip 110 is become worse, and thus increases the risks of leakage current. However, a process could be controlled to form the flowing insulating material layer 150 having the sufficient thickness T1 on the side surface 115, but a thickness T2 of the flowing insulating material layer 150 below the second surface 117 is correspondingly increased. During the repeated test of heating and cooling the chip package 100, the flowing insulating material layer 150 having great thickness is easily to be cracked due to thermal expansion and contraction, and thus also disconnects the conductive layer 160. In some embodiments, the flowing insulating material layer 150 has a smallest thickness T1 at a corner 119 between the second surface 117 and the side surface 115.

To solve above problems, the insulating layer 140 having a thickness T3 is interposed between the chip 110 and the flowing insulating material layer 150. The insulating layer 140 is formed of low-k dielectric material, which has compact structure and stable property, so as to maintain excellent insulating property of the chip 110. In addition, the insulating layer 140 is not flowable, so it could uniformly cover the second surface 117 and the side surface 115. As such, even if the small thickness T1 of flowing insulating material layer 150 on the side surface 115 decreases the distance between the conductive layer 160 and the chip 110, the insulating layer 140 still maintains excellent insulating property of the chip 110 to ensure it not in contact with the conductive layer 160, and thus avoids the unwanted electrical connection. On the other hand, an amount of a flowing material is not increased, so the flowing insulating material layer 150 below the second surface 117 is maintained at the appropriate thickness T2. As such, the conductive layer 160 is no longer under the risk of disconnection during the repeated test of heating and cooling. It is worth noting that the chip 110 has poor insulating property when the thickness T3 of the insulating layer 140 is too small, but the insulating layer 140 having great thickness T3 is also adverse for forming the subsequent conductive layer 160. In some embodiments, the thickness T3 of the insulating layer 140 is in a range from about 0.5 μm to about 1.5 μm, preferably 1 μm. In some embodiments, the flowing insulating material layer 150 has the thickness T1 of 6 μm to 10 μm on the side surface 115. In some embodiments, the flowing insulating material layer 150 has the thickness T2 of 20 μm to 25 μm below the second surface.

In some embodiments, the insulating layer 140 includes an oxide, a nitride, an oxynitride, or combinations thereof, which the oxide is silicon oxide, the nitride is silicon nitride, and the oxynitride is silicon oxynitride, but not limited thereto. In some embodiments, the flowing insulating material layer 150 includes an epoxy, such as a photosensitive epoxy.

In addition, the flowing insulating material layer 150 has a trench 152 to expose the conductive pad 112 protruded from the side surface 115, and the trench 152 is further extended into the spacer layer 120. The conductive layer 160 is disposed below the flowing insulating material layer 150 and extended into the trench 152 to contact the conductive pad 112. The protective layer 170 is disposed below the conductive layer 160 to cover it, and the protective layer 170 has an opening 172 exposing the conductive layer 160. The external conductive connection 180 is disposed in the opening 172 and in contact with the conductive layer 160. As such, the external conductive connection 180 is electrically connected to the sensing region 114 via the conductive layer 160 and the conductive pad 112, so as to deliver the signal of the sensing region 114 to an external device, such as a printed circuit board. In some embodiments, the conductive layer 160 includes aluminum, copper, nickel or any suitable conductive material; the protective layer 170 includes an epoxy, such as a photosensitive epoxy; and the external conductive connection 180 includes a solder ball, a bump or other well-known structures in the industry, and a shape of the external conductive connection 180 includes spherical, oval, square or rectangular, but not limited thereto.

Figure 2:
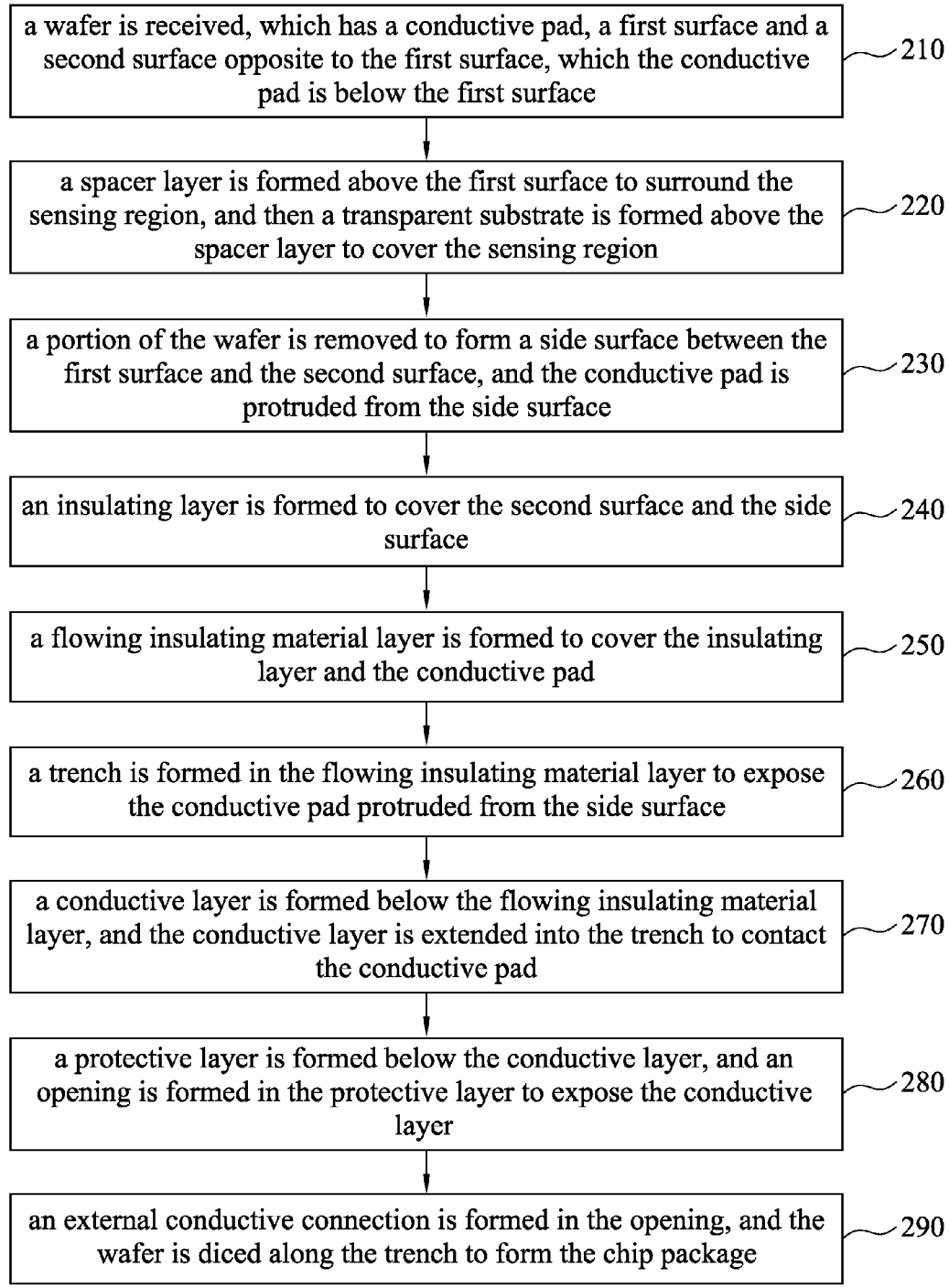
FIG. 2 illustrates a flow chart of a method of fabricating the chip package, in accordance with various embodiments.

Refer to FIG. 2, which illustrates a flow chart of a method of fabricating the chip package, in accordance with various embodiments. Refer to FIGS. 3A to 3H at the same time to further understand the fabricating process of the chip package. FIGS. 3A to 3H are cross-sectional views of the chip package in FIG. 1 at intermediate stages of fabrication, in accordance with various embodiments.

Figure 3A:
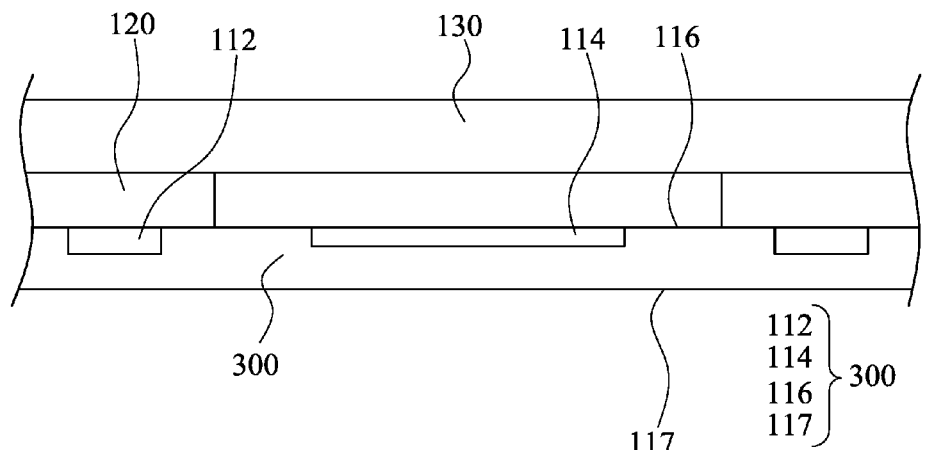
FIGS. 3A to 3H are cross-sectional views of the chip package in FIG. 1 at intermediate stages of fabrication, in accordance with various embodiments.

Refer first to step 210 and FIG. 3A, a wafer 300 is received, which has a conductive pad 112, a first surface 116 and a second surface 117 opposite to the first surface 116, which the conductive pad 112 is below the first surface 116. Specifically, the wafer 300 has a plurality of chip districts, and these chip districts are separated to independent chip packages 100 after dicing the wafer 300 in the subsequent step. In some embodiments, the wafer 300 includes a semiconductor device, an inter-layer dielectric layer (ILD), an inter-metal dielectric layer (IMD), a passivation layer and an interconnection structure, and the conductive pad 112 is one of metal layers of the interconnection structure. In some embodiments, the wafer 300 further includes a sensing region 114 disposed between two conductive pads 112 and electrically connected to these conductive pads 112. Continuing in step 220 and FIG. 3A, a spacer layer 120 is formed above the first surface 116 to surround the sensing region 114, and then a transparent substrate 130 is formed above the spacer layer 120 to cover the sensing region 114.

Figure 3B:
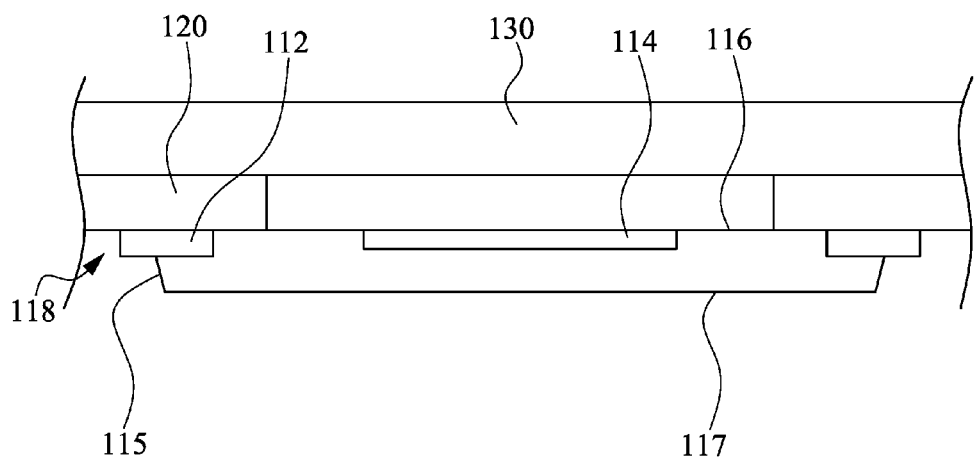

Refer to step 230 and FIG. 3B, a portion of the wafer 300 is removed to form a side surface 115 between the first surface 116 and the second surface 117, and the conductive pad 112 is protruded from the side surface 115. In this step, the portion of the wafer 300 is removed by photolithography etching, so as to form an opening 118 in the wafer 300 to expose the conductive pad 112. Specifically, the opening 118 is formed to make the wafer 300 have the side surface 115 connecting the conductive pad 112 and the second surface 117, and a potion of the conductive pad 112 is protruded from the side surface 115 and exposed in the opening 118.

Figure 3C:
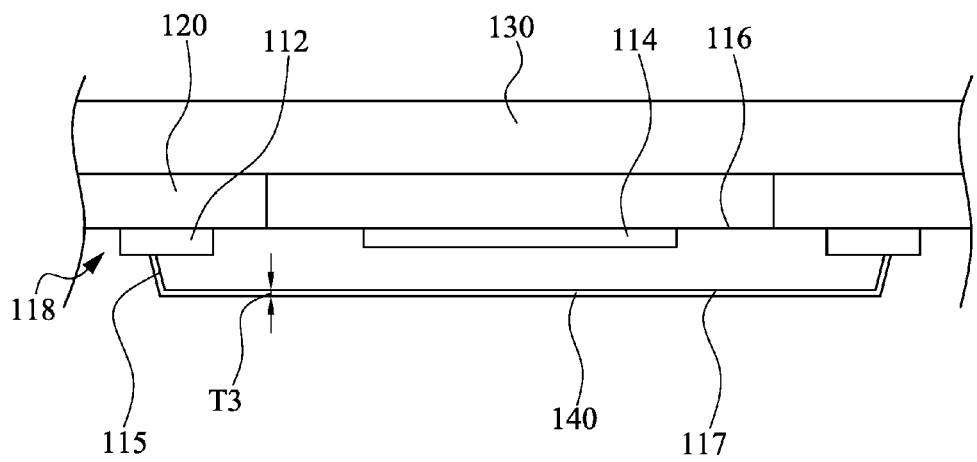

Refer to step 240 and FIG. 3C, an insulating layer 140 is formed to cover the second surface 117 and the side surface 115. In this step, a low-k dielectric material is deposited on the second surface 117 and the side surface 115 by using chemical vapor deposition (CVD), so as to form the insulating layer 140. Since low-k dielectric material has low flowability, it will not be affected by gravity, so the insulating layer 140 has a uniform thickness T3. In some embodiments, the thickness T3 of the insulating layer 140 is in a range from about 0.5 μm to about 1.5 μm, preferably 1 μm.

Figure 3D:
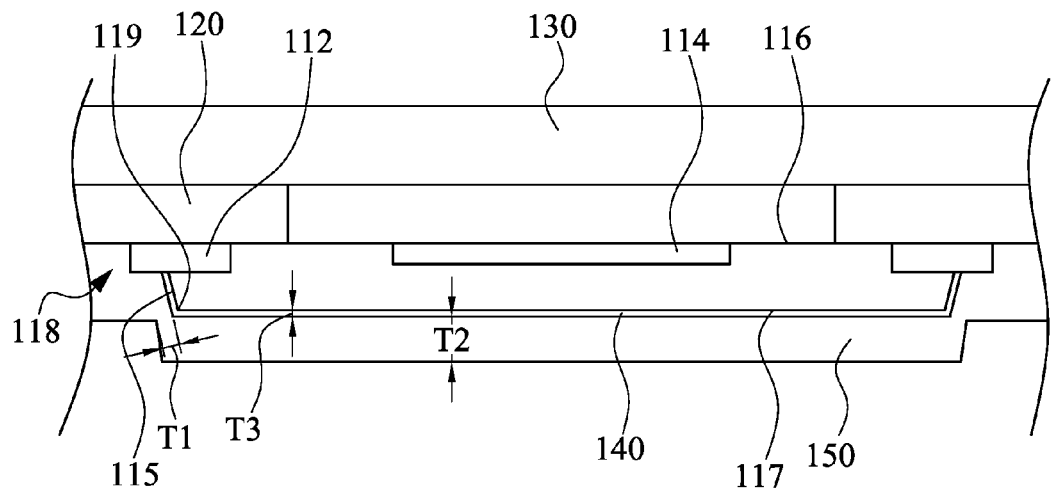

Continuing to step 250 and FIG. 3D, a flowing insulating material layer 150 is formed to cover the insulating layer 140 and the conductive pad 112. In this step, the flowing insulating material layer 150 is formed on the second surface 117 and in the opening 118 by coating, depositing or printing, so as to cover the spacer layer 120 and the conductive pad 112 exposed in the opening 118. It is worth noting that the flowing insulating material layer 150 has flowablity before curing, so a portion of the flowing insulating material layer 150 on the side surface 115 is affected by gravity and flows toward a bottom of the opening 118. As such, the flowing insulating material layer 150 has a thickness T1 on the side surface 115 and a thickness T2 below the second surface 117, and the thickness T1 is smaller than the thickness T2. However, the insulating layer 140 covering the side surface 115 still maintains excellent insulating property of the wafer 300. In some embodiments, the flowing insulating material layer 150 has the smallest thickness T1 at a corner 119 between the second surface 117 and the side surface 115. In some embodiments, the flowing insulating material layer 150 includes an epoxy, such as a photosensitive epoxy, so an exposure process is further performed to crosslink and cure the flowing insulating material layer 150.

Figure 3E:
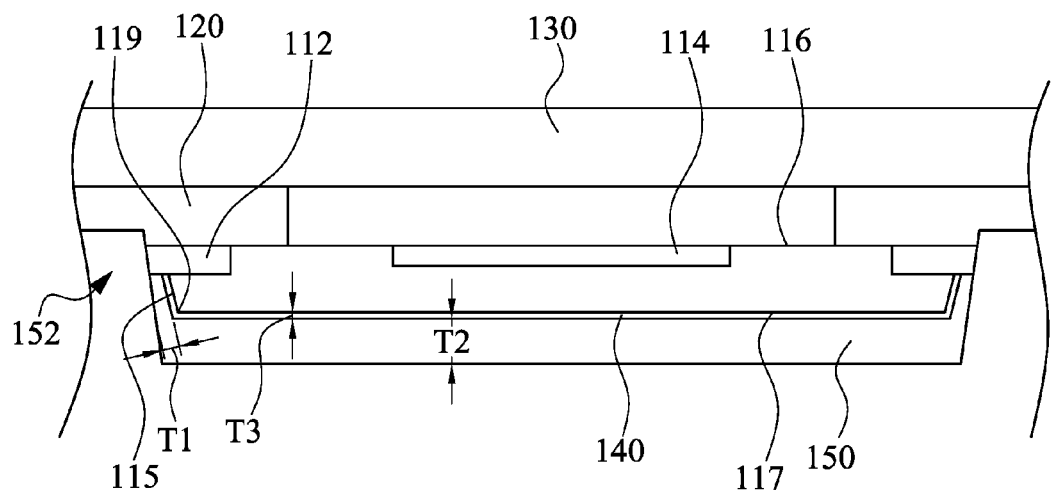

Continuing in step 260 and FIG. 3E, a trench 152 is formed in the flowing insulating material layer 150 to expose the conductive pad 112 protruded from the side surface 115. In this step, a knife is used to cut off a portion of the flowing insulating material layer 150, a potion of the conductive pad 112 and a portion of the spacer layer 120, so as to form the trench 152 exposing the conductive pad 112 protruded from the side surface 115.

Figure 3F:
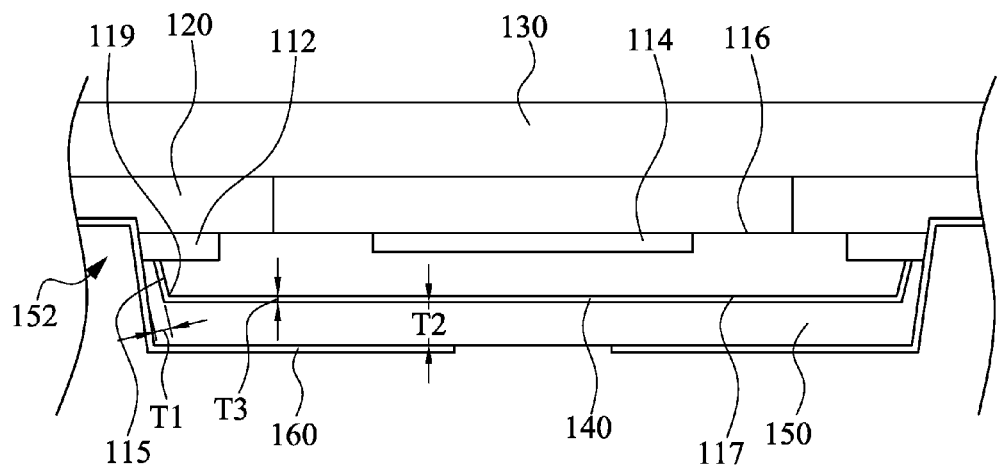

Continuing in step 270 and FIG. 3F, a conductive layer 160 is formed below the flowing insulating material layer 150, and the conductive layer 160 is extended into the trench 152 to contact the conductive pad 112. For example, a conductive material is deposited by sputtering, evaporating, electroplating or electroless plating to form the conductive layer 160. As aforementioned, even if the small thickness T1 of the flowing insulating material layer 150 on the side surface 115 decreases the distance between the conductive layer 160 and the side surface 115 of the chip 110, the insulating layer 140 still maintains excellent insulating property to avoid the leakage current. In addition, the flowing insulating material layer 150 is directly cut by the knife to form the trench 152 exposing the conductive pad 112, and thus further saves the costs of exposing and developing the flowing insulating material layer 150. In some embodiments, the conductive layer 160 includes aluminum, copper, nickel or any suitable conductive material.

Figure 3G:
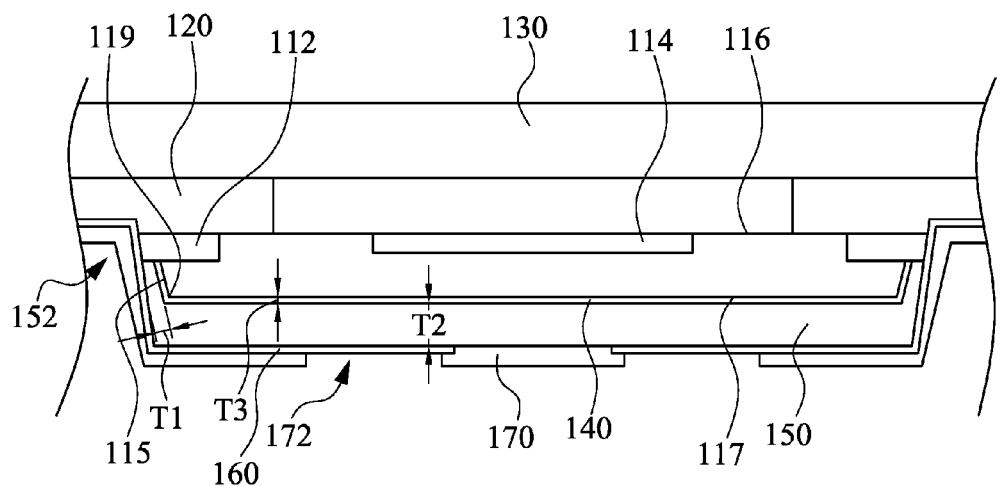

Continuing in step 280 and FIG. 3G, a protective layer 170 is formed below the conductive layer 160, and an opening 172 is formed in the protective layer 170 to expose the conductive layer 160. In this step, an epoxy material is brush-coated below the conductive layer 160 to form the protective layer 170. Then, the protective layer 170 is pattered to form the opening 172, so as to expose a portion of the conductive layer 160 from the opening 172 of the protective layer 170. In the present disclosure, the protective layer 170 is formed of a photosensitive epoxy, which is directly photolithography etched to pattern the protective layer 170 and form the opening 172, so the pattern of the protective layer 170 could be defined without using a photoresist layer. In some embodiments, the protective layer 170 and the flowing insulating material layer 150 are formed of the same material, but not limited thereto.

Figure 3H:
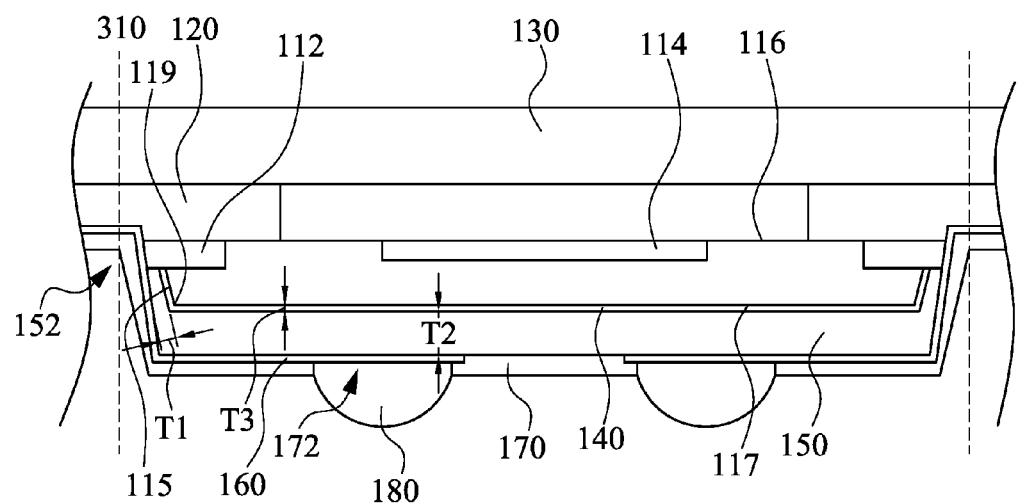

Continuing in step 290 and FIG. 3H, an external conductive connection 180 is formed in the opening 172 to contact the conductive layer 160, and the wafer 300 is diced along the trench 152 to form the chip package. The external conductive connection 180 includes a solder ball, a bump or other well-known structures in the industry, and a shape of the external conductive connection 180 includes spherical, oval, square or rectangular, but not limited thereto. After forming the external conductive connection 180, the protective layer 170, the conductive layer 160, the spacer layer 120 and the transparent substrate 130 are dice along a scribe line 310 in the trench 152, so as to separate the chip districts of the wafer 300, and the independent chip package is formed. In the present disclosure, the scribe line 310 is in the trench 152.

The embodiments of the present disclosure discussed above have advantages over existing methods and structures, and the advantages are summarized below. A chip package of the present disclosure has an insulating layer interposed between the chip and the flowing insulating material layer. The insulating layer ensures excellent insulating property of the chip, so as to avoid the conductive layer contacting the chip and generating unwanted electrical connection. In addition, the present disclosure enhances the insulating property of the chip without increasing a thickness of the flowing insulating material layer. As such, it is avoided that the flowing insulating material layer having great thickness is cracked under the a test of heating and cooling the chip package, meanwhile the conductive layer is no longer under the risk of disconnection, and thus significantly increases the yield and reliability of the chip package. On the other hand, before a dicing process for the chip package is utilized, processes performed on the wafer are with a wafer level, so that the manufacturing cost of the chip package is lower than a conventional wire-bonding process. Moreover, after the cutting process, the chip package is a chip scale package (CSP), thereby facilitating the miniaturization design of the chip package.

Although the present invention has been described in considerable detail with reference to certain embodiments thereof, other embodiments are possible. Therefore, the spirit and scope of the appended claims should not be limited to the description of the embodiments contained herein. Reference will now be made in detail to the embodiments of the invention, examples of which are illustrated in the accompanying drawings. Wherever possible, the same reference numbers are used in the drawings and the description to refer to the same or like parts.

What is claimed is:

1. A chip package, comprising:
   a chip having a conductive pad, a side surface, a first surface and a second surface opposite to the first surface, the side surface being between the first surface and the second surface, and the conductive pad being below the first surface and protruded from the side surface;
   an insulating layer having a flat portion covering the second surface and the side surface, the insulating layer having a side portion abutting the side surface of the chip;
   a flowing insulating material layer disposed below the insulating layer and extending along the side portion of the insulating layer to the conductive pad;
   a trench exposing the conductive pad protruded from the side surface; and
   a conductive layer disposed below the flowing insulating material layer and extended into the trench to contact the conductive pad.

2. The chip package of claim 1, wherein the insulating layer comprises oxide, nitride, oxynitride, or combinations thereof.

3. The chip package of claim 2, wherein the insulating layer comprises silicon oxide, silicon nitride, silicon oxynitride, or combinations thereof.

4. The chip package of claim 1, wherein the flowing insulating material layer comprises an epoxy.

5. The chip package of claim 1, wherein a thickness of the insulating layer is in a range from about 0.5 μm to about 1.5 μm.

6. The chip package of claim 1, wherein the flowing insulating material layer has a thickness of 20 μm to 25 μm below the second surface.

7. The chip package of claim 1, wherein the flowing insulating material layer has a thickness of 6 μm to 10 μm on the side portion.

8. The chip package of claim 1, further comprising:
   a protective layer disposed below the conductive layer, and the protective layer having an opening to expose the conductive layer;
   an external conductive connection disposed in the opening and in contact with the conductive layer.

9. The chip package of claim 8, wherein the chip further comprises a sensing region disposed below the first surface.

10. The chip package of claim 9, further comprising:
    a space layer disposed above the first surface to surround the sensing region; and
    a transparent substrate disposed above the space layer to cover the sensing region.

11. A method of fabricating a chip package, the method comprising:
    receiving a wafer, the wafer having a conductive pad, a first surface and a second surface opposite to the first surface, and the conductive pad being below the first surface;
    removing a portion of the wafer to form a side surface between the first surface and the second surface, and the conductive pad being protruded from the side surface;
    forming an insulating layer having a flat portion to cover the second surface and the side surface, the insulating layer having a side portion abutting the side surface of the chip;
    forming a flowing insulating material layer below the insulating layer and extending along the side portion of the insulating layer to the conductive pad;

forming a trench to expose the conductive pad protruded from the side surface; and forming a conductive layer below the flowing insulating material layer, and the conductive layer extended into the trench to contact the conductive pad.

12. The method of fabricating the chip package of claim 11, wherein the wafer further comprises a sensing region below the first surface.

13. The method of fabricating the chip package of claim 12, further comprising:

forming a space layer above the first surface to surround the sensing region; and forming a transparent substrate above the space layer to cover the sensing region.

14. The method of fabricating the chip package of claim 13, further comprising:

forming a protective layer below the conductive layer; and forming an opening in the protective layer to expose the conductive layer.

15. The method of fabricating the chip package of claim 14, further comprising forming an external conductive connection in the opening to contact the conductive layer.

16. The method of fabricating the chip package of claim 15, further comprising dicing the protective layer, the conductive layer, the space layer and the transparent substrate along the trench to form the chip package.

17. The method of fabricating the chip package of claim 11, wherein the insulating layer is formed by chemical vapor deposition.

18. The method of fabricating the chip package of claim 11, wherein the flowing insulating material layer is formed by coating, depositing or printing.

19. The method of fabricating the chip package of claim 11, wherein the insulating layer comprises oxide, nitride, oxynitride, or combinations thereof.

20. The method of fabricating the chip package of claim 19, wherein the insulating layer comprises silicon oxide, silicon nitride, silicon oxynitride, or combinations thereof.

21. The method of fabricating the chip package of claim 11, wherein the flowing insulating material layer comprises an epoxy.

* * * * *